United States Patent [19]
Ohta

[11] Patent Number: 5,801,971
[45] Date of Patent: Sep. 1, 1998

[54] FORM SIMULATION DEVICE AND ITS SIMULATING METHOD BY THE USE OF THE MONTE CARLO METHOD

[75] Inventor: Toshiyuki Ohta, Tokyo, Japan

[73] Assignee: NEC Corporation, Tokyo, Japan

[21] Appl. No.: 768,578

[22] Filed: Dec. 18, 1996

[30] Foreign Application Priority Data

Dec. 18, 1995  [JP]  Japan .................................. 7-328640

[51] Int. Cl.$^6$ .................................................. G06F 9/455
[52] U.S. Cl. ............................ 364/578; 364/488; 216/59
[58] Field of Search ................................ 364/578, 488, 364/489, 490, 491; 216/59, 67

[56] References Cited

U.S. PATENT DOCUMENTS

| | | | |
|---|---|---|---|
| 5,070,469 | 12/1991 | Kunikiyo et al. | 364/578 |
| 5,282,140 | 1/1994 | Tazawa et al. | 364/578 |
| 5,421,934 | 6/1995 | Misaka et al. | 216/59 |
| 5,646,870 | 7/1997 | Krivokapic et al. | 364/578 |

OTHER PUBLICATIONS

Brockschmidt, "Inside Ole 2: The Fast Track to Building Powerful Object–Oriented Applications with Windows Objects", Microsoft Press Programming Series, pp. 67–72.

Ardehali, "Effect of Image Force on Ion Current Density in Plasma Discharges", IEEE Trans on Plasma Sci, vol. 24, Iss. 1, Feb. 1996, pp. 241–245.

Rhallako et al., "Computer Simulation of Carbon–Deposition Plasma in $CH_4$," IEEE Trans on Plasma Sci, vol. 19, Iss. 2, Apr. 1991, pp. 270–277.

Hoekstra et al., "A Model for Surface & Bulk Chemistry During Silicon Etching in High Plasma Density Inductively Coupled Reactors", 1995 IEEE Int'l Conf on Plasma Sci, p. 248.

Hyman et al., "Integrated Model for Plasma CVD & Etch Processes", 1995 Int'l Conf on Plasma Sci, p. 119.

Shibkov et al., "Numerical Simulation of Local Charging During Plasma Etching of a Dielectric Material", Electronics Letters, vol. 32, Iss. 10, May 1996.

Harafuji et al., *Applied Physics Transaction*, vol. 62, No. 11, pp. 1111–1118, (1993).

Misaka et al., "A Simulation of Micro–Loading Phenomena in Dry–Etching Process Using a New Adsorption Model", IEDM, pp. 857–860, (1993).

Primary Examiner—Kevin J. Teska
Assistant Examiner—Tyrone V. Walker
Attorney, Agent, or Firm—Foley & Lardner

[57] ABSTRACT

A form simulation device comprising a bulk plasma analytical unit making an analysis of a bulk plasma region and calculating potential, density of particles and change of sheath length with time within plasma when RF bias is given there, a sheath plasma analytical unit deciding the type of incident particle on the basis of the obtained particle density, a surface reaction calculation unit deciding absorbed material on the surface of the material to be etched, which the incident particle collides with and deciding the type of reaction between the absorbed material and the incident particle decided by the sheath plasma analytical unit, and a form calculation unit calculating the form of the material to be etched depending on the type of reaction decided by said surface reaction calculation unit.

13 Claims, 5 Drawing Sheets

| REACTION | NUMBER | REACTION CONSTANT |
|---|---|---|
| $CF_3-Si + CF_3^+ \rightarrow C_2F_6 + Si$ | 1 | $R^1$ |
| $CF_3-Si + CF_3^+ \rightarrow CF_4 + CF_4^+ + Si$ | 2 | $R^2$ |
| ... | ... | ... |
| $CF_3-Si + CF_3^+ \rightarrow C_2F_6 + Si^+$ | j | $R^j$ |
| ... | ... | ... |

FIG. 4

15 FORM OF MATERIAL TO BE ETCHED
16 ORBIT OF PARTICLE
FINE REGION 17
18 FORM AFTER ETCHING

FORM SIMULATION DEVICE AND ITS SIMULATING METHOD BY THE USE OF THE MONTE CARLO METHOD

BACKGROUNDS OF THE INVENTION

1. Field of the Invention

The present invention relates to a simulation method of simulating the changing form of a work piece according to a process. More particularly, it relates to a simulation device and its simulating method which analyzes the form produced by plasma etching in the manufacturing process of a semiconductor device by the use of the Monte Carlo method, and its simulating method.

2. Description of the Related Art

As a conventional simulating method of etching form, such a general method has been used that simulation is performed on the assumption that the etching process is an isotropy etching or a complete anisotropy etching. This conventional simulating method, however, cannot serve to represent the actual process correctly owing to the improvement in fine processing technique, thereby becoming an unpractical method at the present time.

Figure 7:
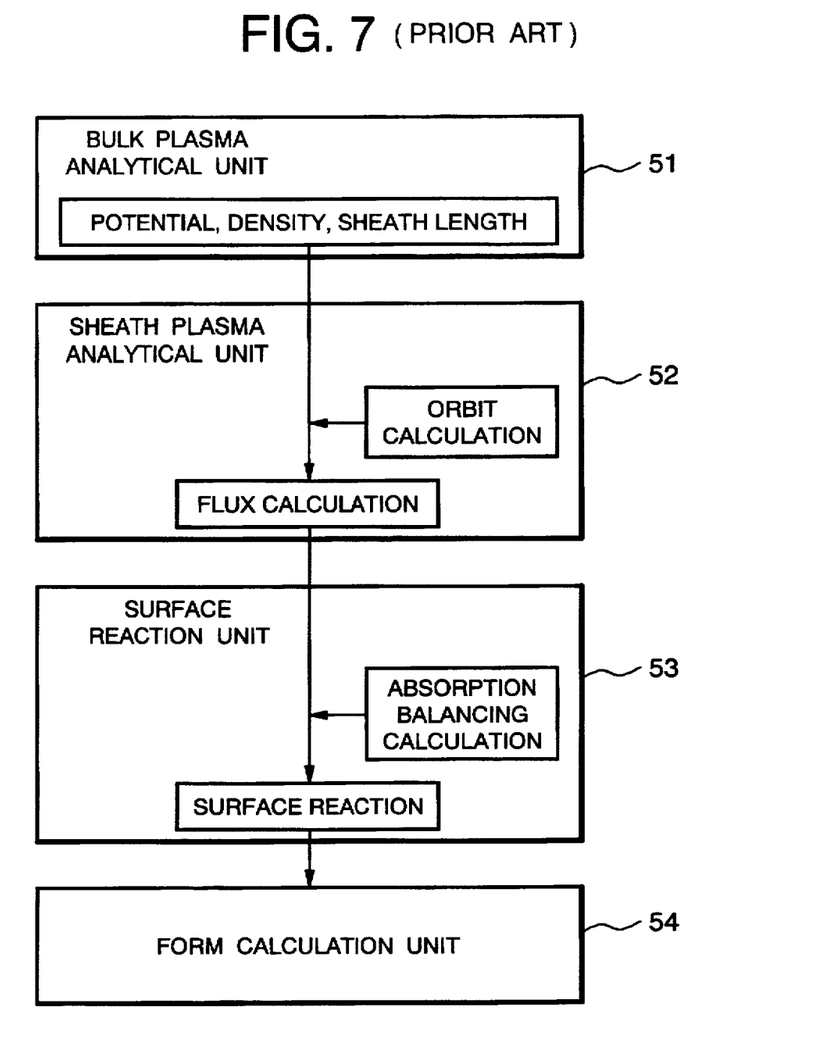
FIG. 7 is a block diagram showing the conventional form simulating method.

Nowadays, some examinations are tried with respect to analytical technique of plasma, and a technique of analyzing potential distribution and density within plasma by the use of a fluid model, the Monte Carlo method, or the like, has been developed. The use of the plasma analytical result enables the calculation of simulating the form produced by the plasma etching. As this kind of simulating method, a method, for example, disclosed in the article "Modeling and simulation of dry etching process" (pp. 1111–1118, No. 11, Vol. 62, Applied Physics Transaction, 1993) written by Harafuji and Kubota, is proposed. FIG. 7 is a block diagram for use in describing the simulating method disclosed in this article.

With reference to FIG. 7, a bulk plasma analytical unit (RF glow discharge unit) 51 analyzes potential and particle density within the plasma at first. A sheath plasma analytical unit (ion transport unit) 52 calculates orbit and energy of an incident particle, and further calculates a flux of the incident particle by the use of the calculated value. A surface reaction unit 53 calculates the change of composition of absorbed materials on the surface in a fine region according to the time (the change due to the reaction on the surface). As the result of the surface reaction, when the etching is performed on the surface of the material to be etched, a form calculation unit 54 calculates the etching form by the use of a string model.

The conventional form simulating method by the use of the above plasma analysis, however, has the following problems.

As a first problem, it is impossible to specify the elementary process produced on the surface of the material to be etched and to perform a simulation on a level of particle, thereby to prevent from improving the calculation accuracy. In the plasma etching, reaction of the plasma is extremely rapid, so that it is important to grasp the elementary reaction on the surface. The conventional simulating method, however, calculates the change of the state on the surface by solving the absorption balancing formula of the flux of the particle and the absorbed material on the surface of the material to be etched. Therefore, simulation is not performed on a level of particle, but a balancing calculation is substituted for the reaction between each particle.

As a second problem, calculation time becomes long because of calculating the absorption balancing formulas with respect to all the absorbed materials. In the actual reaction, since the reaction is made on a level of particle, it is not necessary to consider all the absorbed materials in the simulation. However, the above conventional simulation method, in which the absorption balancing must be considered, needs to consider all the absorbed materials. Therefore, calculation time becomes long uselessly.

SUMMARY OF THE INVENTION

A first object of the present invention is to provide a form simulation device and its simulating method capable of highly accurate simulation, in consideration of elementary process on the surface of the material to be etched.

A second object of the present invention is to provide a form simulation device and its simulating method capable of shortening the calculation time by calculating the change of only the absorbed material which each incident particle collides with.

According to the first aspect of the invention, a form simulation device analyzing form of material which is etched by plasma etching, comprises a bulk plasma analytical means making an analysis of a bulk plasma region and calculating potential, density of particle and change of sheath length with time within plasma when RF bias is given there;

a sheath plasma analytical means deciding the type of incident particle which is incident on the material to be etched from the plasma by the use of random numbers on the basis of the particle density obtained by the analysis of said bulk plasma analytical means;

a surface reaction calculation means deciding absorbed material on the surface of the material to be etched, which the incident particle absorbs, on the basis of the state on the surface of the material to be etched, by the use of the Monte Carlo method, and deciding the type of reaction between the absorbed material and the incident particle decided by said sheath plasma analytical means, on the basis of reaction constant for every type of reaction, by the use of the Monte Carlo method; and a form calculation means calculating the form of the material to be etched depending on the type of reaction decided by said surface reaction calculation means.

In the preferred construction, the sheath plasma analytical means decides the type of incident particle which is incident on the material to be etched from the plasma and calculates the energy of the incident particle whose type is decided in the above, and the surface reaction calculation means decides the type of reaction between the incident particle and the absorbed material so as to reflect the energy of the incident particle calculated by said sheath plasma analytical means.

In the preferred construction, the sheath plasma analytical means decides the type of incident particle which is incident on the material to be etched from the plasma and calculates initial velocity of the incident particle whose type is decided in the above on the basis of the Maxwell distribution by the use of the Monte Carlo method, to calculate the orbit of the incident particle on the basis of the calculated initial velocity of the incident particle, by the use of the equation of motion and the Poisson equation, thereby to obtain the energy of the incident particle, and the surface reaction calculation means decides the type of reaction between the incident particle and the absorbed material so as to reflect the energy of the incident particle calculated by said sheath plasma analytical means.

In another preferred construction, the sheath plasma analytical means decides the type of incident particle which is incident on the material to be etched from the plasma and calculates the energy of the incident particle whose type is decided in the above, and the surface reaction calculation means decides the type of reaction between the incident particle and the absorbed material, on the basis of table data including the type of reaction and a predetermined reaction constant reflecting the energy of the incident particle, which has been prepared for every combination of the incident particle type and the absorbed material, by the use of the Monte Carlo method.

In another preferred construction, the surface reaction calculation means decides the absorbed material in every fine region on the surface of the material to be etched and the type of reaction between the incident particle and the absorbed material.

Also, the sheath plasma analytical means decides the type of incident particle which is incident on the material to be etched from the plasma and calculates the energy of the incident particle whose type is decided in the above, and the surface reaction calculation means decides the type of reaction between the incident particle and the absorbed material in every fine region on the surface of the material to be etched so as to reflect the energy of the incident particle calculated by said sheath plasma analytical means.

According to the second aspect of the invention, a form simulation device analyzing form of material which is etched by plasma etching, comprises:

- a bulk plasma analytical means making an analysis of a bulk plasma region to analyze motion of each particle within plasma, and deciding the type and energy of incident particle which is incident on the material to be etched from the plasma;
- a surface reaction calculation means deciding absorbed material on the surface of the material to be etched, which the incident particle absorbs, on the basis of the state on the surface of the material to be etched, by the use of the Monte Carlo method, and deciding the type of reaction between the incident particle and the absorbed material so as to reflect the energy of the incident particle calculated by said plasma analytical means, on the basis of reaction constant for every type of reaction, by the use of the Monte Carlo method; and
- a form calculation means calculating the form of the material to be etched depending on the type of reaction decided by said surface reaction calculation means.

In the preferred construction, the surface reaction calculation means decides the type of reaction between the incident particle and the absorbed material, on the basis of table data including the type of reaction and a predetermined reaction constant reflecting the energy of the incident particle, which has been prepared for every combination of the incident particle type and the absorbed material, by the use of the Monte Carlo method.

In another preferred construction, the surface reaction calculation means decides the type of reaction between the incident particle and the absorbed material in every fine region on the surface of the material to be etched so as to reflect the energy of the incident particle calculated by said sheath plasma analytical means.

According to the third aspect of the invention, a form simulating method provided with a plasma analytical means making an analysis of plasma, a surface reaction calculation means calculating reaction on the surface of the material to be etched, on the basis of the state on the surface of the material to be etched and the result of the plasma analysis by said plasma analytical means, and a form calculation means analyzing the form of the material which is etched by the plasma etching, on the basis of the calculation result by said surface reaction calculation means, the method comprises the steps of:

- a first step of calculating the potential, the density of particle, the change of sheath length with time within the plasma when RF bias is given there, by making an analysis of the bulk plasma region;
- a second step of deciding the type of incident particle which is incident on the material to be etched from the plasma, on the basis of the particle density obtained by the analysis of said bulk plasma analytical means, by the use of the random numbers;
- a third step of deciding absorbed material on the surface of the material to be etched, which the incident particle absorbs, on the basis of the state on the surface of the material to be etched, by the use of the Monte Carlo method;
- a fourth step of deciding the type of reaction between the absorbed material and the incident particle whose type is decided in said second step, by the use of the Monte Carlo method; and
- a fifth step of calculating the form of the material to be etched depending on the type of reaction decided in said fourth step.

In the above-mentioned construction, a form simulating method further comprises

- a sixth step of calculating the energy of the incident particle whose type is decided in said second step, after said second step of deciding the type of incident particle and before said fourth step of deciding the reaction between the incident particle and the absorbed material, the method in which
- in said fourth step, the type of reaction between the incident particle and the absorbed material is decided so as to reflect the energy of the incident particle calculated in said sixth step.

According to another aspect of the invention, in a computer readable memory storing a computer program which controls a form simulation system provided with a plasma analytical means making an analysis of plasma, a surface reaction calculation means calculating reaction on the surface of the material to be etched, on the basis of the state on the surface of the material to be etched and the result of the plasma analysis by said plasma analytical means, and a form calculation means analyzing the form of the material to be etched which is etched by the plasma etching, on the basis of the calculation result by said surface reaction calculation means, said computer program comprises:

- a first step of calculating the potential, the density of particle, the change of sheath length with time within the plasma when RF bias is given there, by making an analysis of the bulk plasma region;
- a second step of deciding the type of incident particle which is incident on the material to be etched from the plasma, on the basis of the particle density obtained by the analysis of said bulk plasma analytical means, by the use of the random numbers;
- a third step of deciding absorbed material on the surface of the material to be etched, which the incident particle absorbs, on the basis of the state on the surface of the material to be etched, by the use of the Monte Carlo method;
- a fourth step of deciding the type of reaction between the absorbed material and the incident particle whose type is decided in said second step, by the use of the Monte Carlo method; and a fifth step of calculating the form of the material to be etched depending on the type of reaction decided in said fourth step.

Other objects, features and effects of the present invention will be apparent from the following detailed description.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
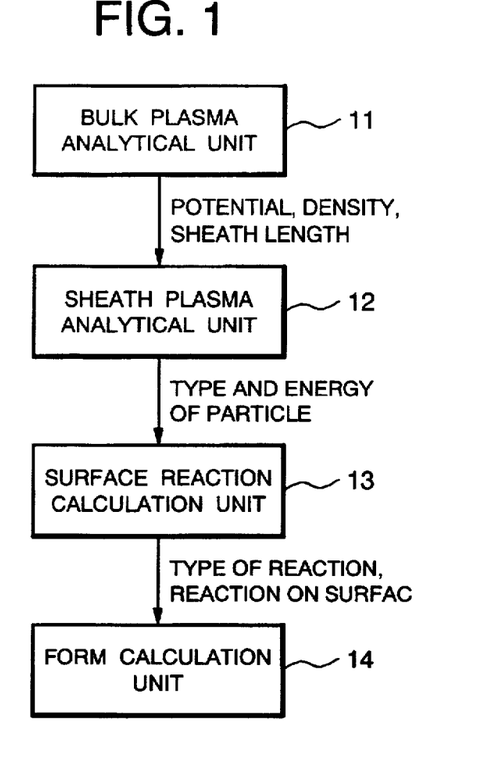
FIG. 1 is a block diagram showing a form simulating method according to a first embodiment of the present invention.

FIG. 1 is a block diagram showing a constitution of a form simulation device according to a first embodiment of the present invention.

As illustrated in FIG. 1, a form simulating method of this embodiment comprises a bulk plasma analytical unit 11 analyzing bulk plasma, a sheath plasma analytical unit 12 analyzing sheath plasma ranging with the bulk plasma and deciding an incident particle, a surface reaction calculation unit 13 deciding the type of absorbed material and reaction depending on the state on the surface of the material to be etched and simulating the reaction on the surface, and a form calculation unit 14 calculating the change in the form of the material to be etched according to the type of reaction decided by the surface reaction calculation unit 13. FIG. 1 shows only the characteristic constitution, while omitting the description of the other general constitution. Each unit is realized by, for example, a CPU controlled by a program. Each function being realized by the module of a computer program, this embodiment can be provided as a computer program stored in a storage such as a magnetic disk, optical disk, or the like.

In a plasma generator for use in plasma etching, weakly ionized plasma produced by high frequency discharge or the like is divided into a bulk plasma region where the plasma density is relatively high and a sheath plasma region, adjacent to the bulk plasma region, where the plasma density is relatively low and strong electric field is formed. Therefore, this embodiment is provided with the bulk plasma analytical unit 11 and the sheath plasma analytical unit 12, as mentioned above.

The bulk plasma analytical unit 11 calculates the potential, the density of each particle (ion, electron, radical), and the charge of sheath length with time within the plasma when RF bias of frequency is given there, by solving the equation of continuity and the Poisson equation for a charged particle simultaneously with the difference calculus.

The sheath plasma analytical unit 12, assuming that an incident particle which is incident on the material to be etched is produced at the sheath boundary portion (boundary between the bulk plasma region and the sheath plasma region) within the plasma, decides the type, orbit and energy of the incident particle by the use of the analytical result of the bulk plasma analytical unit 11. More specifically, the sheath plasma analytical unit 12 decides the type of incident particle by the use of the random numbers and the table of density of each particle obtained by the bulk plasma analytical unit 11. Then, the initial velocity of the incident particle whose type is decided is calculated on the basis of the Maxwell distribution by the use of the Monte Carlo method, and the orbit of the incident particle is calculated by the use of the equation of motion and the Poisson equation. The energy of the incident particle at the time of being incident on the material to be etched (wafer) is calculated.

The surface reaction calculation unit 13 calculates the reaction on the surface on the basis of the type and energy of the incident particle decided by the sheath plasma analytical unit 12. The calculating procedure of the surface reaction by the surface reaction calculation unit 13 will be described hereinafter.

The state on the surface of the material to be etched in a given fine region is represented by the table data having the absorbed material on the surface defined as "k" and its absorbed ratio defined as "$A^k$". The absorbed material "k" is defined with the adequate order according to the state on the surface. By way of example, "o" represents a clean surface, "1" represents the state on the surface where an H atom is absorbed, and "2" represents the state on the surface where an F atom is absorbed, and the like. The surface reaction calculation unit 13 decides the absorbed material "k" which the incident particle obtained by the sheath plasma analytical unit 12 collides with, by the Monte Carlo method.

Figure 3:
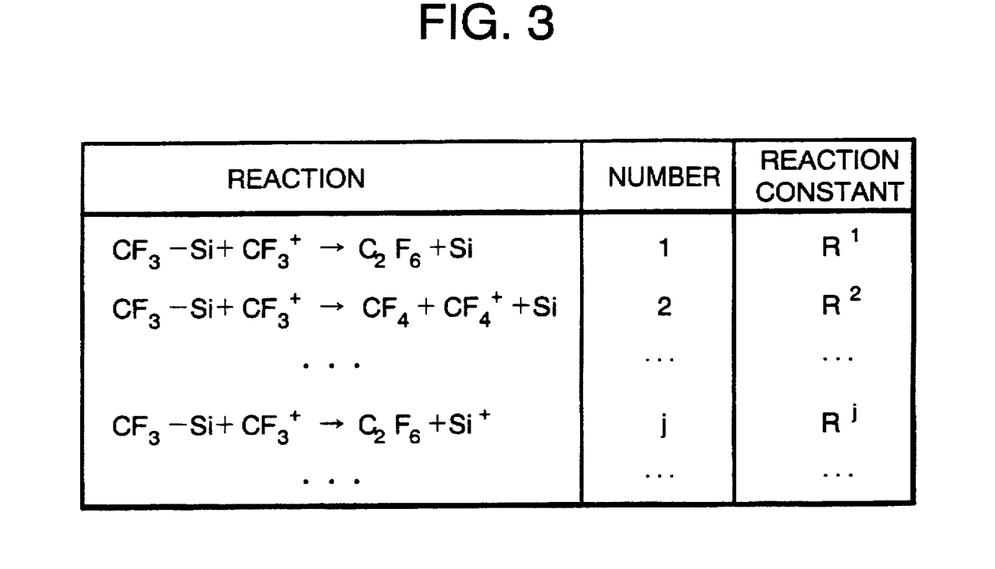
FIG. 3 is a view showing an example of table data consisting of type of reaction and reaction constant.

The reaction which may happen between the decided absorbed material "k" and the incident particle is decided this time. Even if the absorbed material "k" and the incident particle are decided, the reaction happening therebetween is not restricted to one type, but no reaction may be found in some reaction sectional area (collision sectional area). By the use of the table data including the type of reaction and its reaction constant (reaction sectional area), which is prepared for every combination of the absorbed material "k" and the incident particle, as illustrated in FIG. 3, with the random numbers added there, the type of the reaction is decided by the Monte Carlo method. At this time, it is arranged that the reaction constant varies according to the energy of the incident particle and as a result, the energy of the incident particle reflects the type of reaction.

The table data of the reaction which may happen, for example, in the case where the incident particle is $CF_3^+$ ion, and the absorbed material "k" is Si—$CF_3$, is shown in FIG. 3. Assume that the number "m" types of reaction may happen. The reaction constant "$R^i$" is given to each reaction considering the energy of the incident particle. Each reaction constant may be required by the molecular orbital method, or by the use of the value obtained from the experiment result.

The reaction on the surface of the material to be etched is calculated in the above process.

Figure 4:
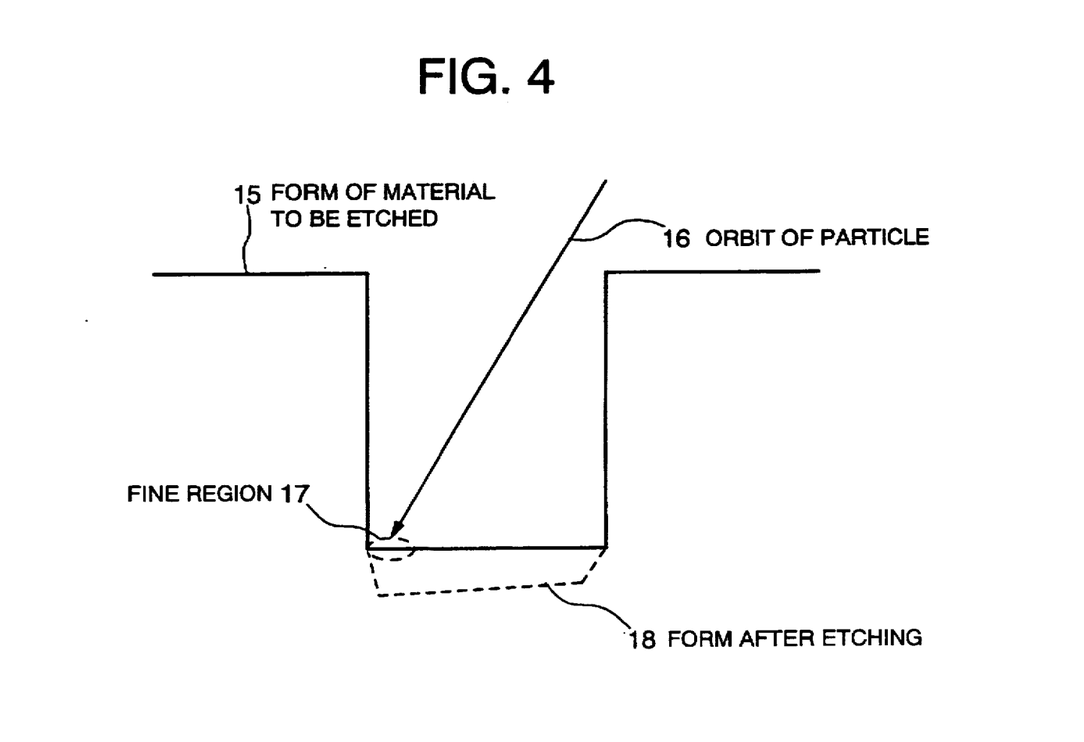
FIG. 4 is a cross-sectional view in the vicinity of the surface of the material to be etched, showing the etching form achieved by the first embodiment.

The form calculation unit 14 calculates the form on the surface of the material to be etched depending on the type of reaction selected by the surface reaction calculation unit 13. FIG. 4 is one example of the form on the surface of the material to be etched which is shown in a two dimensional string model. As illustrated in the figure, string is moved to in the direction in which the incident particle is going to, thereby to perform the etching. In FIG. 4, the form after the etching is shown in a broken line 18.

An operation of the form simulation according to the embodiment constituted in the above will be described with reference to the flow chart of FIG. 2.

The bulk plasma analytical unit 11 calculates the potential, the density of each particle (ion, electron and radical) and the change of sheath length with time within the plasma when RF bias of frequency is given there (Step 201).

The sheath plasma analytical unit 12 decides the type, energy and orbit of the incident particle. The type of incident particle is decided by the use of the random number "x1" and the table of density of each particle obtained by the bulk plasma analytical unit 11 (Step 202). In case of simulating the plasma etching of a silicon base by carbon tetrafluoride $CF_4$, for example, $CF_3^+$ ion is selected depending on the value of the random number "x1". Alternatively, electron or neutral radical, instead of ion, may be selected, depending on the condition and the random number.

The initial velocity of the incident particle is calculated and the orbit of the incident particle is calculated by the use of the equation of motion and the Poisson equation. The energy of the incident particle at the time of its being incident on the material to be etched is calculated (Step 203). In the above example, the orbit and energy of $CF_3^+$ ion is calculated.

The surface reaction calculation unit 13 calculates the surface reaction. As illustrated in FIG. 4, such an example will be described that, with respect to the form 15 of the material to be etched, a fine region 17 between string points is extracted and the incident particle (in the above example, $CF_3^+$ ion) is incident on the fine region 17. An arrow in FIG. 4 shows the orbit 16 of the incident particle.

At first, the absorbed material "k" which the incident particle obtained by the sheath plasma analytical unit 12 collides with, is decided by the Monte Carlo method (Step 204). More specifically, the random number x2 is used and the absorbed material "k" is decided as follows.

$$S^{k-1} \leq x2 \cdot S^n < S^k \tag{1}$$

Assuming that there are the number "n+1" of absorbed materials from "o (clean surface)" to "n (integral number of 1 or above)" inclusive, "$S^k$" shall be represented by the following formula (2).

$$S^k = \sum_{l=0}^{k} A^l \tag{2}$$

"$S^{-1}$" is defined as "0" ("$S^{-1}$"=0). In the above example, the absorbed material "k" is decided as, for example, Si—$CF_3$.

The reaction happening between the decided absorbed material "k" and the above-mentioned incident particle is decided this time (Step 205). The type of reaction is decided by the use of the table data shown in FIG. 3 as for the above example. Namely, the surface reaction calculation unit 13 selects "i" which satisfies the following formula (3) by generating the random number x3.

$$W^{i-1} \leq x3 \cdot W^m < W^i \tag{3}$$

"$W^i$" is represented by the following formula (4).

$$W^i = \sum_{l=1}^{i} R^l \tag{4}$$

"$W^0$" is defined as "0" ("$W^0$"=0). In the table data of FIG. 3, assume that, for example, the reaction of the number j, namely, the reaction "$CF_3$—Si+$CF_3^+ \rightarrow C_2F_6$+$Si^+$" shall be selected. In this reaction, Si—$CF_3$ disappears, Si is etched and the clean surface of Si appears on the surface of the material to be etched.

The form calculation unit 14 calculates the form of the surface of the material to be etched (Step 206). In the above example, since "$CF_3$—Si+$CF_3^+ \rightarrow C_2F_6$+$Si^+$" has been selected as the reaction on the surface, assuming that the ratio of CF3 being absorbed is "$A^k$", the ratio of the clean silicon surface is "$A^o$" and the variation amount of the absorption ratio is "$\Delta$", the following formulas are established, thereby etching the silicon base.

$$A^k = A^k - \Delta \tag{5}$$

$$A^o = A^o + \Delta \tag{6}$$

As the result of calculating the form of the surface of the material to be etched in the above-mentioned way, the string is moved to in the direction in which the incident particle is going to, and the etching is executed as illustrated by the broken line 18.

As mentioned above, the first embodiment of the present invention takes into consideration the reaction energy dependency for the calculation of the surface reaction. For example, by the increment of the incident energy from 1 eV to 10 eV in the collision of $CF_3^+$ ion, the value of the collision sectional area varies by one digit or so. In the form of the present embodiment, since the reaction energy independency is taken into consideration, the change in the collision sectional area can be reflected in the simulation result, thereby achieving more accurate analysis than that of the conventional simulating method.

Figure 5:
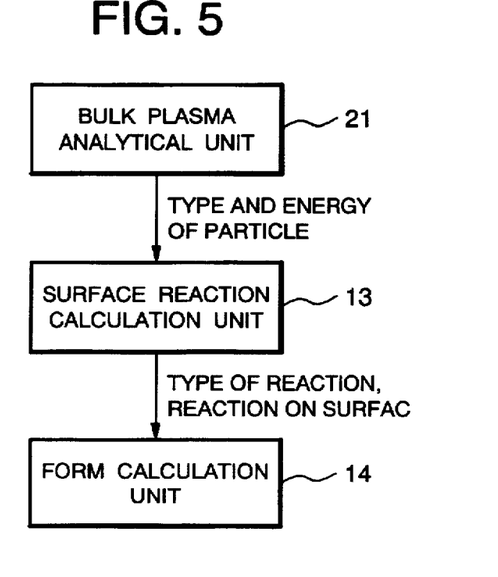
FIG. 5 is a block diagram showing a form simulating method according to a second embodiment of the present invention.

FIG. 5 is a block diagram showing a constitution of a form simulation device according to the second embodiment of the present invention.

As illustrated in FIG. 5, the form simulating method of the embodiment comprises a bulk plasma analytical unit 21 analyzing bulk plasma and deciding an incident particle, a surface reaction calculation unit 13 deciding the type of absorbed material and reaction depending on the state on the surface of the material to be etched and simulating the reaction on the surface, and a form calculation unit 14 calculating the change in the form of the material to be etched according to the type of reaction decided by the surface reaction calculation unit 13. FIG. 5 shows only the characteristic constitution, while omitting the description of the other general constitution. Each unit is realized by, for example, a CPU controlled by a program. Each function being realized by the module of a computer program, this embodiment can be provided as a computer program stored in a storage such as a magnetic disk, optical disk, or the like. In the above constitution, the surface reaction calculation unit 13 and the form calculation unit 14 respectively have the same structure as each of the first embodiment shown in FIG. 1, thereby omitting the description thereof with the same reference numerals attached thereon.

The bulk plasma analytical unit 21 analyzes bulk plasma by the PIC/MCS (Particle-in-Cell/Monte Carlo Simulation) method and decides the type and energy of the particle incident on the surface of the material to be etched. In other words, some particles are produced in the bulk plasma by the Monte Carlo method and the motion of these particles in the electric field is analyzed. Considering the influence of the electromagnetic field formed by the particles, the charge of the particle is interpolation-distributed at the joints thereabout and the whole of the plasma is analyzed by solving the Poisson equation with the difference calculus. By the use of the obtained electro-magnetic field, the motion of the particle is analyzed and the type and energy of the incident particle is decided.

Figure 6:
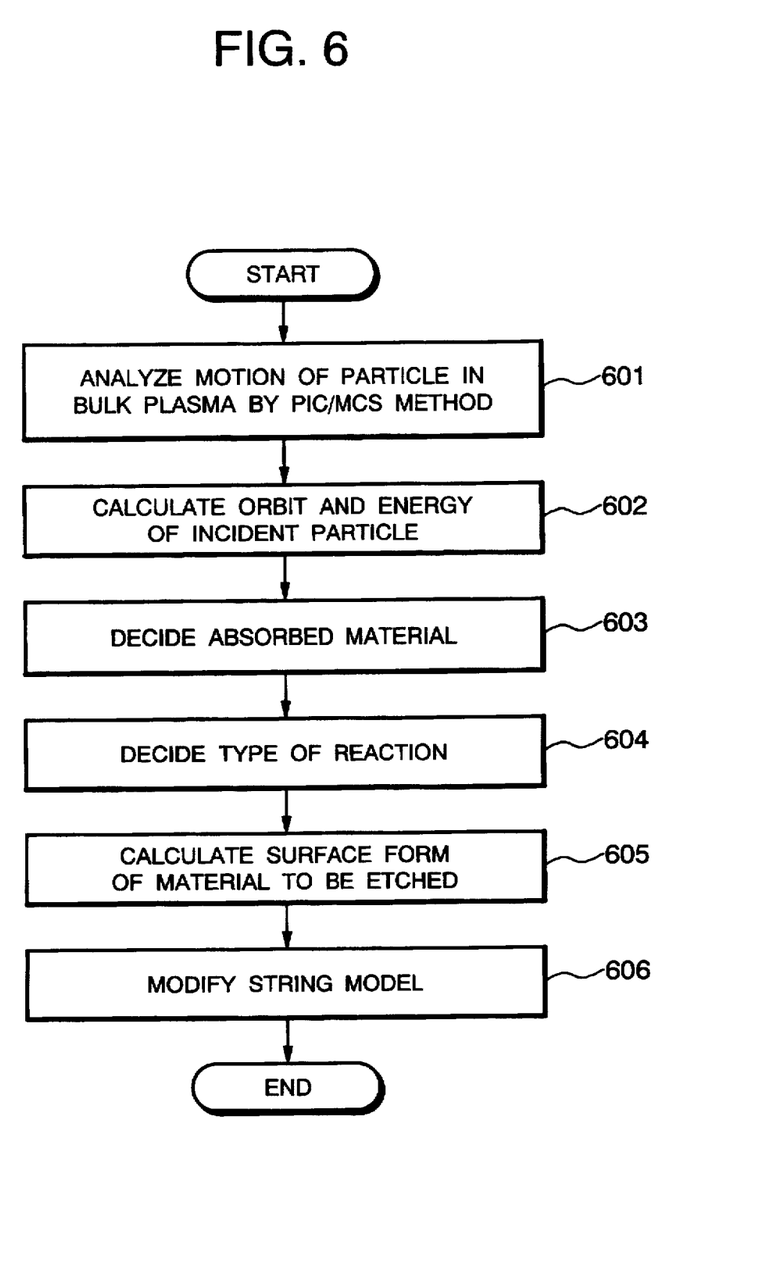
FIG. 6 is a flow chart showing the operation of the second embodiment.

A simulating operation according to this embodiment is illustrated in the flow chart of FIG. 6.

The bulk plasma analysis unit 21 analyzed the motion of each particle within the bulk plasma by the use of the PIC/MCS method (Step 601). The type of incident particle is decided and the energy of the incident particle is calculated by the use of the Monte Carlo method (Step 602).

Figure 2:
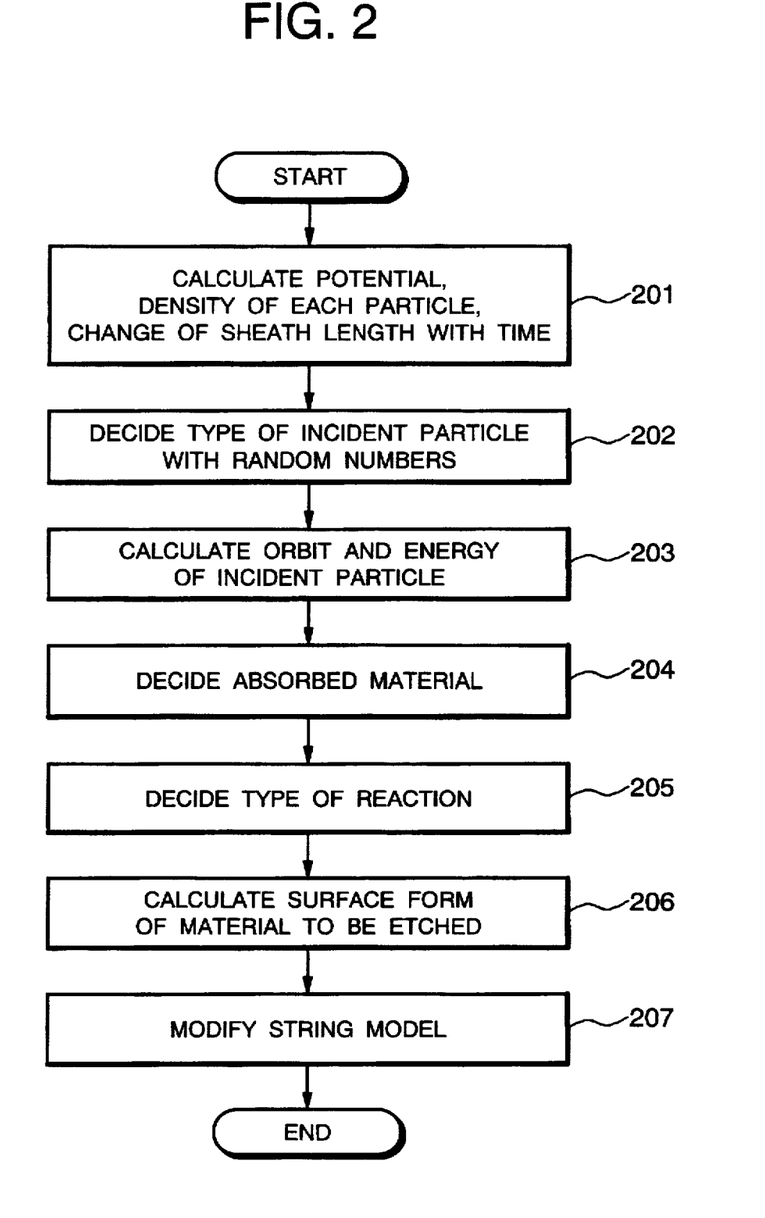
FIG. 2 is a flow chart showing the operation of the first embodiment.

An operation after Step 603 is similar to the operation after Step 204 of the first embodiment shown in FIG. 2.

The second embodiment as mentioned above, in which the PIC/MCS method is used, performs the non-balanced analysis with respect to the sheath plasma region self-consistently with the analysis of the bulk plasma, thereby improving the analytical accuracy and convergence and omitting the process of the sheath analysis so to shorten the calculation time.

As set forth hereinabove, since the form simulation device and its simulating method of the present invention decides the type and energy of the incident particle, absorbed material of the surface which the incident particle collides with, and the elementary reaction between the incident particle and the absorbed material, by the use of the Monte Carlo method, it is advantageous in that the simulation can be performed at a level of individual atom or individual molecule, thereby achieving a highly accurate simulation.

Further, since the form simulation device and its simulating method of the present invention decides the absorbed material which the incident particle collides with, it is not necessary to calculate the change in the all absorbed materials, thereby shortening the calculating time extremely.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A form simulation device analyzing form of material which is etched by plasma etching, comprising:

a bulk plasma analytical means making an analysis of a bulk plasma region and calculating potential, density of particle and change of sheath length with time within plasma when RF bias is given there;

a sheath plasma analytical means deciding the type of incident particle which is incident on the material to be etched from the plasma by the use of random numbers on the basis of the particle density obtained by the analysis of said bulk plasma analytical means;

a surface reaction calculation means deciding absorbed material on the surface of the material to be etched, which the incident particle absorbs, on the basis of the state on the surface of the material to be etched, by the use of the Monte Carlo method, and deciding the type of reaction between the absorbed material and the incident particle decided by said sheath plasma analytical means, on the basis of reaction constant for every type of reaction, by the use of the Monte Carlo method; and a form calculation means calculating the form of the material to be etched depending on the type of reaction decided by said surface reaction calculation means.

2. A form simulation device as set forth in claim 1, wherein said sheath plasma analytical means decides the type of incident particle which is incident on the material to be etched from the plasma and calculates the energy of the incident particle whose type is decided in the above, and said surface reaction calculation means decides the type of reaction between the incident particle and the absorbed material so as to reflect the energy of the incident particle calculated by said sheath plasma analytical means.

3. A form simulation device as set forth in claim 1, wherein said sheath plasma analytical means decides the type of incident particle which is incident on the material to be etched from the plasma and calculates initial velocity of the incident particle whose type is decided in the above on the basis of the Maxwell distribution by the use of the Monte Carlo method, to calculate the orbit of the incident particle on the basis of the calculated initial velocity of the incident particle, by the use of the equation of motion and the Poisson equation, thereby to obtain the energy of the incident particle, and said surface reaction calculation means decides the type of reaction between the incident particle and the absorbed material so as to reflect the energy of the incident particle calculated by said sheath plasma analytical means.

4. A form simulation device as set forth in claim 1, wherein said sheath plasma analytical means decides the type of incident particle which is incident on the material to be etched from the plasma and calculates the energy of the incident particle whose type is decided in the above, and said surface reaction calculation means decides the type of reaction between the incident particle and the absorbed material, on the basis of table data including the type of reaction and a predetermined reaction constant reflecting the energy of the incident particle, which has been prepared for every combination of the incident particle type and the absorbed material, by the use of the Monte Carlo method.

5. A form simulation device as set forth in claim 1, wherein
said surface reaction calculation means decides the absorbed material in every fine region on the surface of the material to be etched and the type of reaction between the incident particle and the absorbed material.

6. A form simulation device as set forth in claim 1, wherein
said sheath plasma analytical means decides the type of incident particle which is incident on the material to be etched from the plasma and calculates the energy of the incident particle whose type is decided in the above, and
said surface reaction calculation means decides the type of reaction between the incident particle and the absorbed material in every fine region on the surface of the material to be etched so as to reflect the energy of the incident particle calculated by said sheath plasma analytical means.

7. A form simulation device analyzing form of material which is etched by plasma etching, comprising:
a bulk plasma analytical means making an analysis of a bulk plasma region to analyze motion of each particle within plasma, and deciding the type and energy of incident particle which is incident on the material to be etched from the plasma;
a surface reaction calculation means deciding absorbed material on the surface of the material to be etched, which the incident particle absorbs, on the basis of the state on the surface of the material to be etched, by the use of the Monte Carlo method, and deciding the type of reaction between the incident particle and the absorbed material so as to reflect the energy of the incident particle calculated by said plasma analytical means, on the basis of reaction constant for every type of reaction, by the use of the Monte Carlo method; and
a form calculation means calculating the form of the material to be etched depending on the type of reaction decided by said surface reaction calculation means.

8. A form simulation device as set forth in claim 7, wherein
said surface reaction calculation means decides the type of reaction between the incident particle and the absorbed material, on the basis of table data including the type of reaction and a predetermined reaction constant reflecting the energy of the incident particle, which has been prepared for every combination of the incident particle type and the absorbed material, by the use of the Monte Carlo method.

9. A form simulation device as set forth in claim 7, wherein
said surface reaction calculation means decides the type of reaction between the incident particle and the absorbed material in every fine region on the surface of the material to be etched so as to reflect the energy of the incident particle calculated by said sheath plasma analytical means.

10. A form simulating method provided with a plasma analytical means making an analysis of plasma, a surface reaction calculation means calculating reaction on the surface of the material to be etched, on the basis of the state on the surface of the material to be etched and the result of the plasma analysis by said plasma analytical means, and a form calculation means analyzing the form of the material which is etched by the plasma etching, on the basis of the calculation result by said surface reaction calculation means, the method comprising the steps of:
a first step of calculating the potential, the density of particle, the change of sheath length with time within the plasma when RF bias is given there, by making an analysis of the bulk plasma region;
a second step of deciding the type of incident particle which is incident on the material to be etched from the plasma, on the basis of the particle density obtained by the analysis of said bulk plasma analytical means, by the use of the random numbers;
a third step of deciding absorbed material on the surface of the material to be etched, which the incident particle absorbs, on the basis of the state on the surface of the material to be etched, by the use of the Monte Carlo method;
a fourth step of deciding the type of reaction between the absorbed material and the incident particle whose type is decided in said second step, by the use of the Monte Carlo method; and
a fifth step of calculating the form of the material to be etched depending on the type of reaction decided in said fourth step.

11. A form simulating method as set forth in claim 10, further comprising:
a sixth step of calculating the energy of the incident particle whose type is decided in said second step, after said second step of deciding the type of incident particle and before said fourth step of deciding the reaction between the incident particle and the absorbed material, the method in which
in said fourth step, the type of reaction between the incident particle and the absorbed material is decided so as to reflect the energy of the incident particle calculated in said sixth step.

12. In a computer readable memory storing a computer program which controls a form simulation system provided with a plasma analytical means making an analysis of plasma, a surface reaction calculation means calculating reaction on the surface of the material to be etched, on the basis of the state on the surface of the material to be etched and the result of the plasma analysis by said plasma analytical means, and a form calculation means analyzing the form of the material to be etched which is etched by the plasma etching, on the basis of the calculation result by said surface reaction calculation means, said computer program comprising:
a first step of calculating the potential, the density of particle, the change of sheath length with time within the plasma when RF bias is given there, by making an analysis of the bulk plasma region;
a second step of deciding the type of incident particle which is incident on the material to be etched from the plasma, on the basis of the particle density obtained by the analysis of said bulk plasma analytical means, by the use of the random numbers;
a third step of deciding absorbed material on the surface of the material to be etched, which the incident particle absorbs, on the basis of the state on the surface of the material to be etched, by the use of the Monte Carlo method;
a fourth step of deciding the type of reaction between the absorbed material and the incident particle whose type is decided in said second step, by the use of the Monte Carlo method; and a fifth step of calculating the form of the material to be etched depending on the type of reaction decided in said fourth step.

13. In a computer readable memory as set forth in claim 12, said computer program further comprising a sixth step of calculating the energy of the incident particle whose type is decided in said second step, after said second step of deciding the type of incident particle and before said fourth step of deciding the reaction between the incident particle and the absorbed material, wherein in said fourth step, the type of reaction between the incident particle and the absorbed material is decided so as to reflect the energy of the incident particle calculated in said sixth step.

* * * * *